(12) United States Patent
Kim

(10) Patent No.: US 11,646,084 B2
(45) Date of Patent: May 9, 2023

(54) MEMORY DEVICE PERFORMING PROGRAM OPERATION AND METHOD OF OPERATING THE SAME

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/866,149

(22) Filed: May 4, 2020

(65) Prior Publication Data

US 2021/0090660 A1 Mar. 25, 2021

(30) Foreign Application Priority Data

Sep. 19, 2019 (KR) .......................... 10-2019-0115340

(51) Int. Cl.

| | | |
|---|---|---|
| *G11C 16/24* | (2006.01) | |
| *G11C 11/56* | (2006.01) | |
| *G11C 16/04* | (2006.01) | |
| *G11C 16/08* | (2006.01) | |
| *G11C 16/10* | (2006.01) | |
| *G11C 16/32* | (2006.01) | |
| *G11C 16/34* | (2006.01) | |

(52) U.S. Cl.
CPC .......... *G11C 16/24* (2013.01); *G11C 11/5628* (2013.01); *G11C 11/5671* (2013.01); *G11C 16/0483* (2013.01); *G11C 16/08* (2013.01); *G11C 16/10* (2013.01); *G11C 16/32* (2013.01); *G11C 16/3459* (2013.01)

(58) Field of Classification Search
CPC . G11C 16/24; G11C 11/5628; G11C 11/5671; G11C 16/3459; G11C 16/08; G11C 16/10; G11C 16/32; G11C 16/0483
See application file for complete search history.

(56) References Cited

U.S. PATENT DOCUMENTS 7,307,887 B2 * 12/2007 Chen .................... G11C 11/5628
  360/53
8,619,474 B2 * 12/2013 Goda ................... G11C 11/5628
  365/185.19
9,230,638 B1 * 1/2016 Lim ..................... G11C 11/5642
(Continued)

FOREIGN PATENT DOCUMENTS

KR 1020090092099 A 8/2009
KR 1020100056048 A 5/2010

*Primary Examiner* — Alfredo Bermudez Lozada
(74) *Attorney, Agent, or Firm* — William Park & Associates Ltd.

(57) ABSTRACT

A memory device having an improved program performance includes a memory cell array, a peripheral circuit, and a control logic. The memory cell array includes a plurality of memory cells. The peripheral circuit is configured to program each of the plurality of memory cells to a target program state among a plurality of program states. The control logic is configured to control the peripheral circuit to apply a program voltage to a word line that is coupled to the plurality of memory cells and perform a bit line discharge operation of applying program enable voltages to a plurality of bit lines that is coupled to the plurality of memory cells while the program voltage is applied to the word line. Timings for applying the program enable voltages to the plurality of bit lines are determined based on the corresponding target program states.

13 Claims, 10 Drawing Sheets

(56) References Cited

U.S. PATENT DOCUMENTS

| | | | |
|---|---|---|---|
| 9,711,197 B1* | 7/2017 | Kim | G06F 1/26 |
| 9,990,969 B2* | 6/2018 | Yang | G11C 7/1084 |
| 10,748,622 B2* | 8/2020 | Lin | G11C 16/0483 |
| 2012/0020155 A1* | 1/2012 | Kim | G11C 11/5628 |
| | | | 365/185.03 |
| 2016/0112068 A1* | 4/2016 | Kim | H03M 13/1111 |
| | | | 714/755 |
| 2018/0322918 A1* | 11/2018 | Alam | G11C 11/1657 |
| 2019/0057751 A1* | 2/2019 | Lee | G11C 16/26 |
| 2019/0244674 A1* | 8/2019 | Lee | G11C 16/10 |
| 2019/0333593 A1* | 10/2019 | Lee | G11C 16/26 |
| 2020/0211663 A1* | 7/2020 | Baraskar | G11C 16/3459 |

* cited by examiner

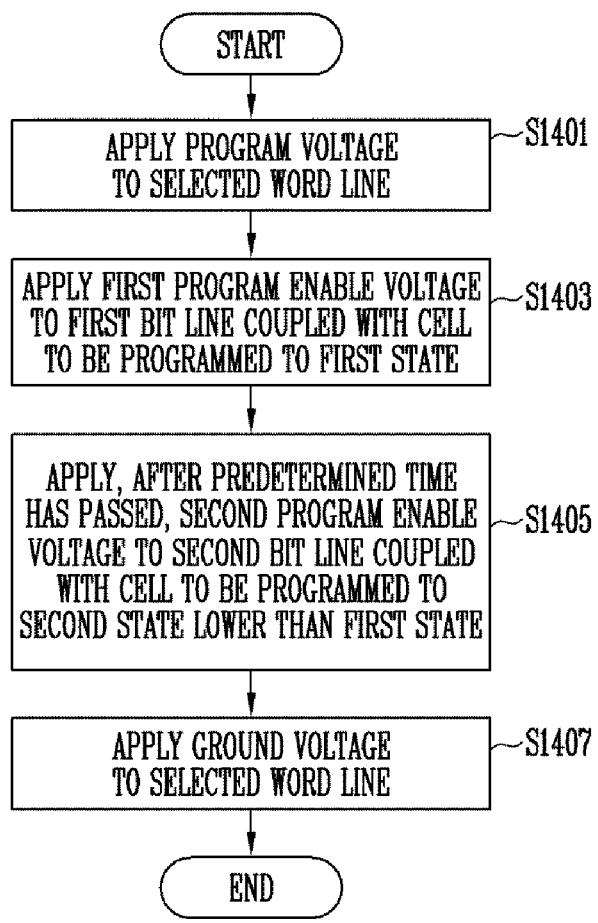

MEMORY DEVICE PERFORMING PROGRAM OPERATION AND METHOD OF OPERATING THE SAME

CROSS-REFERENCE TO RELATED APPLICATION

The present application claims priority under 35 U.S.C. § 119(a) to Korean patent application number 10-2019-0115340, filed on Sep. 19, 2019, in the Korean Intellectual Property Office, the entire disclosure of which is incorporated herein by reference.

BACKGROUND

1. Technical Field

Various embodiments of the present disclosure generally relate to an electronic device, and more particularly, to a memory device and a method of operating the memory device.

2. Related Art

Generally, a storage device is a device that stores data under the control of a host device, such as a computer or a smartphone. The storage device may include a memory device configured to store data, and a memory controller configured to control the memory device. Memory devices are chiefly classified into volatile memory devices and nonvolatile memory devices.

A volatile memory device is a memory device that stores data only when power is supplied thereto and loses the stored data when power is turned off. Examples of a volatile memory device include a static random access memory (SRAM), and a dynamic random access memory (DRAM).

A nonvolatile memory device is a memory device in which data stored therein is maintained even when power is turned off. Examples of a nonvolatile memory device include a read-only memory (ROM), a programmable ROM (PROM), an electrically programmable ROM (EPROM), an electrically erasable programmable ROM (EEPROM), and a flash memory.

SUMMARY

An embodiment of the present disclosure may provide for a method of operating a memory device, including: applying a program voltage to a word line that is coupled to a plurality of memory cells; performing a bit line pre-charge operation by setting electric potential of a plurality of bit lines, coupled to the plurality of memory cells, to a predetermined level; and performing a bit line discharge operation by applying, based on a target program state of each of the plurality of memory cells, a program enable voltage to the plurality of bit lines at different points of time.

An embodiment of the present disclosure may provide for a method of operating a memory device, including: applying a program voltage to a word line that is coupled to a plurality of memory cells; performing a bit line pre-charge operation by setting electrical potential of a plurality of bit lines, coupled to the plurality of memory cells, to a predetermined level; and performing a bit line discharge operation by applying program enable voltages to the plurality of bit lines. Levels of the program enable voltages and points of time at which the program enable voltages are applied to the plurality of respective bit lines may be determined based on target program states of the plurality of memory cells.

An embodiment of the present disclosure may provide for a memory device including a memory cell array, a peripheral circuit, and a control logic. The memory cell array may include a plurality of memory cells. The peripheral circuit may program each of the plurality of memory cells to a target program state among a plurality of program states. The control logic may control the peripheral circuit to apply a program voltage to a word line that is coupled to the plurality of memory cells and perform a bit line discharge operation by applying program enable voltages to a plurality of bit lines that are coupled to the plurality of memory cells while the program voltage is applied to the word line. Timings for applying the program enable voltages to each respective bit line of the plurality of bit lines are determined based on the corresponding target program states.

BRIEF DESCRIPTION OF THE DRAWINGS

FIG. 14 is a flowchart for describing a program operation in accordance with an embodiment.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Hereinafter, the present disclosure will be explained in detail by describing exemplary embodiments of the present disclosure with reference to the accompanying drawings. Hereinafter, embodiments of the present disclosure will be described in detail with reference to the attached drawings.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

Various embodiments of the present disclosure are directed to a memory device having improved program performance, and a method of operating the memory device.

Figure 1:
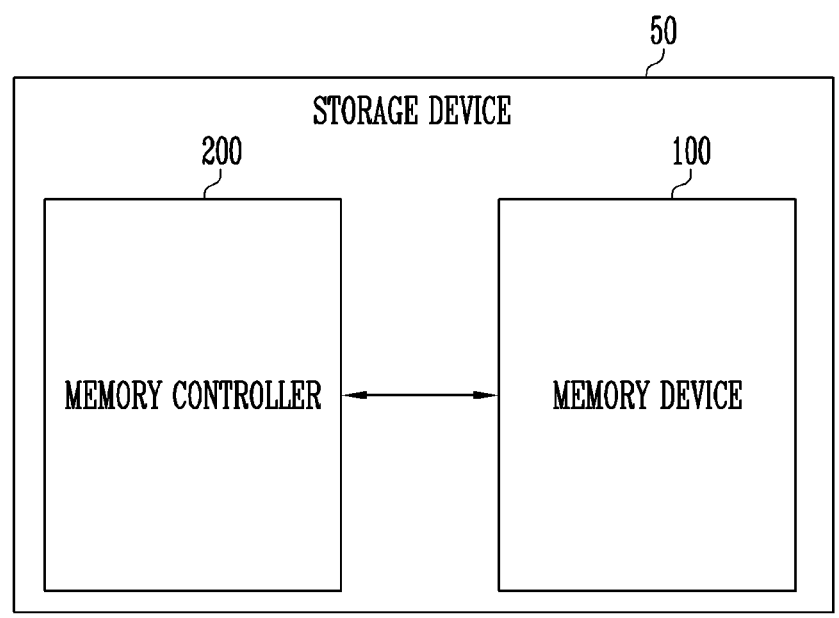
FIG. 1 is a diagram, illustrating a storage device in accordance with an embodiment of the present disclosure.

FIG. 1 is a diagram, illustrating a storage device in accordance with an embodiment of the present disclosure.

Referring to FIG. 1, the storage device 50 may include a memory device 100 and a memory controller 200 that are configured to control the operation of the memory device 100. The storage device 50 may be a device that is configured to store data under the control of a host, such as a cellular phone, a smartphone, an MP3 player, a laptop computer, a desktop computer, a game machine, a TV, a tablet PC, or an in-vehicle infotainment system.

The storage device 50 may be manufactured as any one of various kinds of storage devices depending on the host interface, which is a communication system for communicating with the host. For example, the data storage device 50 may be configured of any one of the various kinds of storage devices, such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types, such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under the control of the memory controller 200. The memory device 100 may include a memory cell array including a plurality of memory cells configured to store data therein.

The memory cells may include a single level cell (SLC) that is capable of storing a single data bit, a multi-level cell (MLC) that is capable of storing two data bits, a triple-level cell (TLC) that is capable of storing three data bits, or a quad-level cell (QLC) that is capable of storing four data bits.

The memory cell array may include a plurality of memory blocks. Each memory block may include a plurality of memory cells. Each memory block may include a plurality of pages. In the embodiment, each page may be a unit of sorting data in the memory device 100 or reading stored data from the memory device 100.

Each memory block may be a unit of erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, for the sake of explanation, it is assumed that the memory device 100 is a NAND flash memory.

The memory device 100 may receive a command and an address from the memory controller 200 and access an area of the memory cell array that is selected by the address. In other words, the memory device 100 may perform an operation, based on the instructions of the command, on the area that is selected by the address. For example, the memory device 100 may perform a write (program) operation, a read operation, or an erase operation. During a program operation, the memory device 100 may program data to an area that is selected by an address. During a read operation, the memory device 100 may read data from an area that is selected by an address. During an erase operation, the memory device 100 may erase data from an area that is selected by an address.

The memory controller 200 may control the overall operations of the storage device 50.

When power is applied to the storage device 50, the memory controller 200 may execute firmware (FW). In the case where the memory device 100 is a flash memory device, the memory controller 200 may execute firmware, such as a flash translation layer (FTL) to control the communication between the host and the memory device 100.

In an embodiment, the memory controller 200 may receive data and a logical block address (LBA) from the host, and translate the LBA into a physical block address (PBA) that indicates the addresses of memory cells in the memory device 100 to which data is to be stored.

The memory controller 200 may control the memory device 100 to perform a program operation, a read operation, or an erase operation in response to a request from the host. During the program operation, the memory controller 200 may provide a write command, a PBA, and data to the memory device 100. During the read operation, the memory controller 200 may provide a read command and a PBA to the memory device 100. During the erase operation, the memory controller 200 may provide an erase command and a PBA to the memory device 100.

In an embodiment, the memory controller 200 may autonomously generate a command, an address, and data, without a request from the host, and transmit them to the memory device 100. For example, the memory controller 200 may provide a command, an address, and data to the memory device 100 to perform background operations, such as a program operation for wear leveling and a program operation for garbage collection.

In an embodiment, the memory controller 200 may control at least two or more memory devices 100. In this case, the memory controller 200 may control the memory devices 100 in an interleaving manner so as to enhance the operating performance. The interleaving scheme may be an operating scheme of overlapping operating periods of at least two or more memory devices 100.

The host may communicate with the storage device 50 using at least one of various communication methods, such as universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
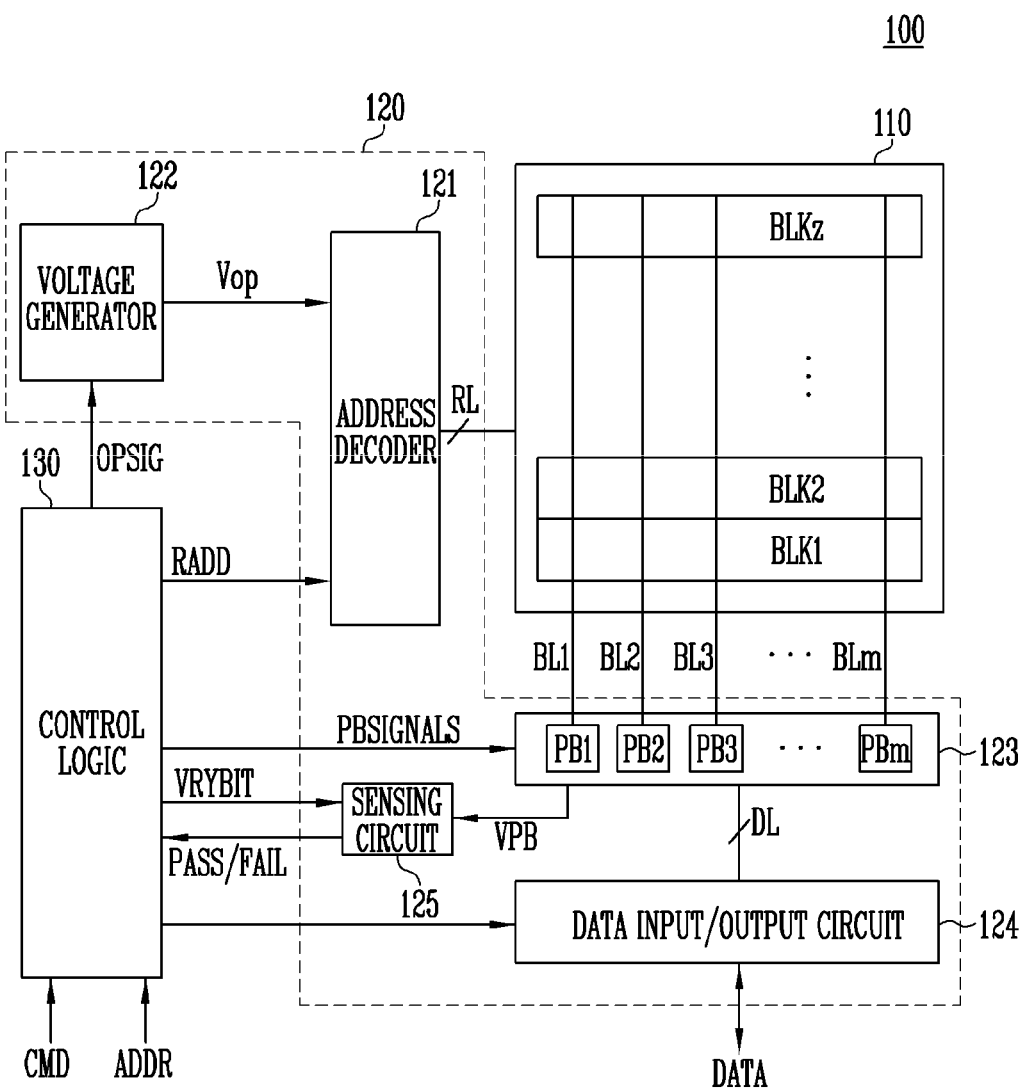
FIG. 2 is a diagram, illustrating the configuration of a memory device of FIG. 1.

FIG. 2 is a diagram, illustrating the configuration of the memory device 100 of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz are coupled to the address decoder 121 through row lines RL. The memory blocks BLK1 to BLKz may be coupled to the read/write circuit 123 through bit lines BL1 to BLm. Each of the memory blocks BLK1 to BLKz may include a plurality of memory cells. In an embodiment, the plurality of memory cells may be nonvolatile memory cells. Among the plurality of memory cells, the memory cells that are coupled to the same word line are defined as one page. In other words, the memory cell array 110 may be formed of a plurality of physical pages. In an embodiment, each of the memory blocks BLK1 to BLKz that is included in the memory cell array 110 may include a plurality of dummy cells. One or more dummy cells may be coupled, in series, between a drain select transistor and memory cells and between a source select transistor and the memory cells.

Each of the memory cells of the memory device 100 may be formed of a single level cell (SLC) that is capable of storing a single data bit, a multi-level cell (MLC) that is capable of storing two data bits, a triple-level cell (TLC) that is capable of storing three data bits, or a quad-level cell (QLC) that is capable of storing four data bits.

The peripheral circuit 120 may include an address decoder 121, a voltage generator 122, a read/write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

In an embodiment, the row lines RL may be local lines included in local line groups. Each local line group may correspond to one memory block. The local line group may include a drain select line, local word lines, and a source select line.

The address decoder 121 may operate under the control of the control logic 130. The address decoder 121 may receive addresses ADDR from the control logic 130.

The address decoder 121 may decode a block address among the received addresses ADDR. The address decoder 121 may select at least one of the memory blocks BLK1 to BLKz based on the decoded block address. The address decoder 121 may decode a row address RADD among the received addresses ADDR. The address decoder 121 may select at least one word line WL of the selected memory block by applying voltages that are supplied from the voltage generator 122 to at least one word line WL based on the decoded row address RADD.

During a program operation, the address decoder 121 may apply a program voltage to a selected word line and apply a pass voltage, having a voltage level lower than that of the program voltage, to unselected word lines. During a program verify operation, the address decoder 121 may apply a verify voltage to a selected word line and apply a verify pass voltage, having a voltage level higher than that of the verify voltage, to unselected word lines.

During a read operation, the address decoder 121 may apply a read voltage to a selected word line and apply a read pass voltage, having a voltage level higher than that of the read voltage, to unselected word lines.

In an embodiment, an erase operation of the memory device 100 may be performed on a memory block basis. During the erase operation, the address decoder 121 may decode a block address, the block address being part of an address ADDR that is input to the memory device 100, and select a corresponding memory block based on the decoded block address. During the erase operation, the address decoder 121 may apply a ground voltage to word lines that are coupled to the selected memory block.

In the embodiment of the present disclosure, the address decoder 121 may decode a column address among the transmitted addresses ADDR. The decoded column address may be transmitted to the read/write circuit 123. For example, the address decoder 121 may include components, such as a row decoder, a column decoder, and an address buffer.

The voltage generator 122 may generate a plurality of operating voltages Vop using an external supply voltage that is supplied to the memory device 100. The voltage generator 122 may operate under the control of the control logic 130.

In the embodiment, the voltage generator 122 may generate an internal supply voltage by regulating the external supply voltage. The internal supply voltage that is generated from the voltage generator 122 may be used as an operating voltage of the memory device 100.

In the embodiment, the voltage generator 122 may generate a plurality of operating voltages Vop by using an external supply voltage or an internal supply voltage. The voltage generator 122 may generate various voltages that are required from the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors that are configured to receive an internal supply voltage and may generate a plurality of operating voltages Vop by selectively enabling the plurality of pumping capacitors under the control of the control logic 130.

The generated operating voltages Vop may be supplied to the memory cell array 110 through the address decoder 121.

The read/write circuit 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may operate under the control of the control logic 130.

The first to m-th page buffers PB1 to PBm may communicate data DATA with the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program voltage is applied to a selected word line. The memory cells in the selected page are programmed based on the transmitted data DATA. Memory cells that are coupled to a bit line to which a program enable voltage (e.g. a ground voltage) is applied may have increased threshold voltages. Threshold voltages of memory cells that are coupled to a bit line to which a program inhibit voltage (for example, a supply voltage) is applied may be retained. During a program verify operation, the first to m-th page buffers PB1 to PBm may read data DATA from selected memory cells through the bit lines BL1 to BLm.

During a read operation, the read/write circuit 123 may read data DATA from the memory cells of the selected page through the bit lines BL, and store the read data DATA in the first to m-th page buffers PB1 to PBm.

During an erase operation, the read/write circuit 123 may float the bit lines BL. In an embodiment, the read/write circuit 123 may include a column select circuit.

The data input/output circuit 124 is coupled to the first to m-th page buffers PB1 to PBm through the data lines DL. The data input/output circuit 124 may operate under the control of the control logic 130.

The data input/output circuit 124 may include a plurality of input/output buffers (not shown) to receive input data DATA. During a program operation, the data input/output circuit 124 may receive data DATA from an external controller (not shown). During a read operation, the data input/output circuit 124 may output, to the external controller, the data DATA that was received from the first to m-th page buffers PB1 to PBm that are included in the read/write circuit 123.

During a read operation or a verify operation, the sensing circuit 125 may generate a reference current in response to an enable bit signal VRYBIT that is generated by the control logic 130, may compare a sensing voltage VPB that is received from the read/write circuit 123 with a reference voltage that is generated by the reference current, and may output a pass signal or a fail signal to the control logic 130.

The control logic 130 may be coupled to the address decoder 121, the voltage generator 122, the read/write circuit 123, the data input/output circuit 124, and the sensing circuit 125. The control logic 130 may control the overall operation of the memory device 100. The control logic 130 may operate in response to a command CMD that is transmitted from an external device.

The control circuit 130 may generate various signals in response to the command CMD and the address ADD to control the peripheral circuit 120. For example, the control logic 130 may generate an operating signal OPSIG, a row address RADD, a read/write circuit control signal PBSIG-NALS, and an enable bit VRYBIT in response to the command CMD and the address ADD. The control logic 130 may output the operating signal OPSIG to the voltage generator 122, output the row address RADD to the address decoder 121, output the read/write control signal to the read/write circuit 123, and output the enable bit VRYBIT to the sensing circuit 125. The control logic 130 may determine whether the target memory cells have passed or failed a verification during the verify operation in response to a pass signal PASS or a fail signal FAIL that is output from the sensing circuit 125.

In an embodiment, the control logic 130 may control the peripheral circuit 120 to perform a program operation on selected memory cells among a plurality of memory cells. The selected memory cells may be programmed to a target program state among a plurality of states based on the data that is to be stored in each memory cell.

The control logic 130 may control the peripheral circuit 120 to apply a program voltage to a selected word line that is coupled to the selected memory cells. The control logic 130 may control the peripheral circuit 120 to perform a bit line pre-charge operation and a bit line discharge operation while a program voltage is applied to the selected word line. The bit line pre-charge operation may be an operation that sets the electric potential of bit lines, coupled to the selected memory cells, to a predetermined level, based on the target program state of the selected memory cells. The bit line discharge operation may be an operation that drops the electric potential of the bit lines, coupled to the selected memory cells, to a program enable voltage level. The control logic 130 may control the peripheral circuit 120 to apply a ground voltage to the selected word line when the bit line discharge operation is completed.

In the embodiment, during a bit line pre-charge operation, the peripheral circuit 120 may apply a program enable voltage or a program inhibit voltage to a bit line, coupled to selected memory cells, based on the target program state of the selected memory cells. The program inhibit voltage may be a power supply voltage. The program enable voltage may have a voltage level lower than that of the program inhibit voltage. In various embodiments, the program enable voltage may include a ground voltage. The program enable voltage may include a negative voltage.

For example, if the target program state is the highest program state among a plurality of states, the peripheral circuit 120 may apply the program enable voltage to the bit line that is coupled to the selected memory cells. If the target program state is a program state other than the highest program state, the peripheral circuit 120 may apply the program inhibit voltage to the bit line that is coupled to the selected memory cells.

In an embodiment, during a bit line discharge operation, the peripheral circuit 120 may apply a program enable voltage to bit lines, coupled to selected memory cells at different time points, based on the target program state of the selected memory cells.

For example, the peripheral circuit 120 may apply an identical program enable voltage to a first bit line and a second bit line among a plurality of bit lines in which the program enable voltage may be applied to the second bit line before being applied to the first bit line. The first bit line may be a bit line that is coupled to cells to be programmed to a first program state. The second bit line may be a bit line that is coupled to cells to be programmed to be a second program state, the second program state being higher than the first program state.

In an embodiment, during a bit line discharge operation, the peripheral circuit 120 may apply different program enable voltages to bit lines, coupled to selected memory cells, based on the target program state of the selected memory cells.

For example, the peripheral circuit 120 may simultaneously apply program enable voltages to a third bit line and a fourth bit line among a plurality of bit lines in which the level of the program enable voltage that is applied to the fourth bit line may be lower than that of the program enable voltage applied to the third bit line. The third bit line may be a bit line that is coupled to cells to be programmed to a third program state. The fourth bit line may be a bit line coupled to cells to be programmed to be a fourth program state higher than the third program state.

In various embodiments, based on the target program state of selected memory cells, the levels of program enable voltages that are applied to the plurality of bit lines or time points at which the program enable voltages are applied to the respective bit lines may differ from each other.

Figure 3:
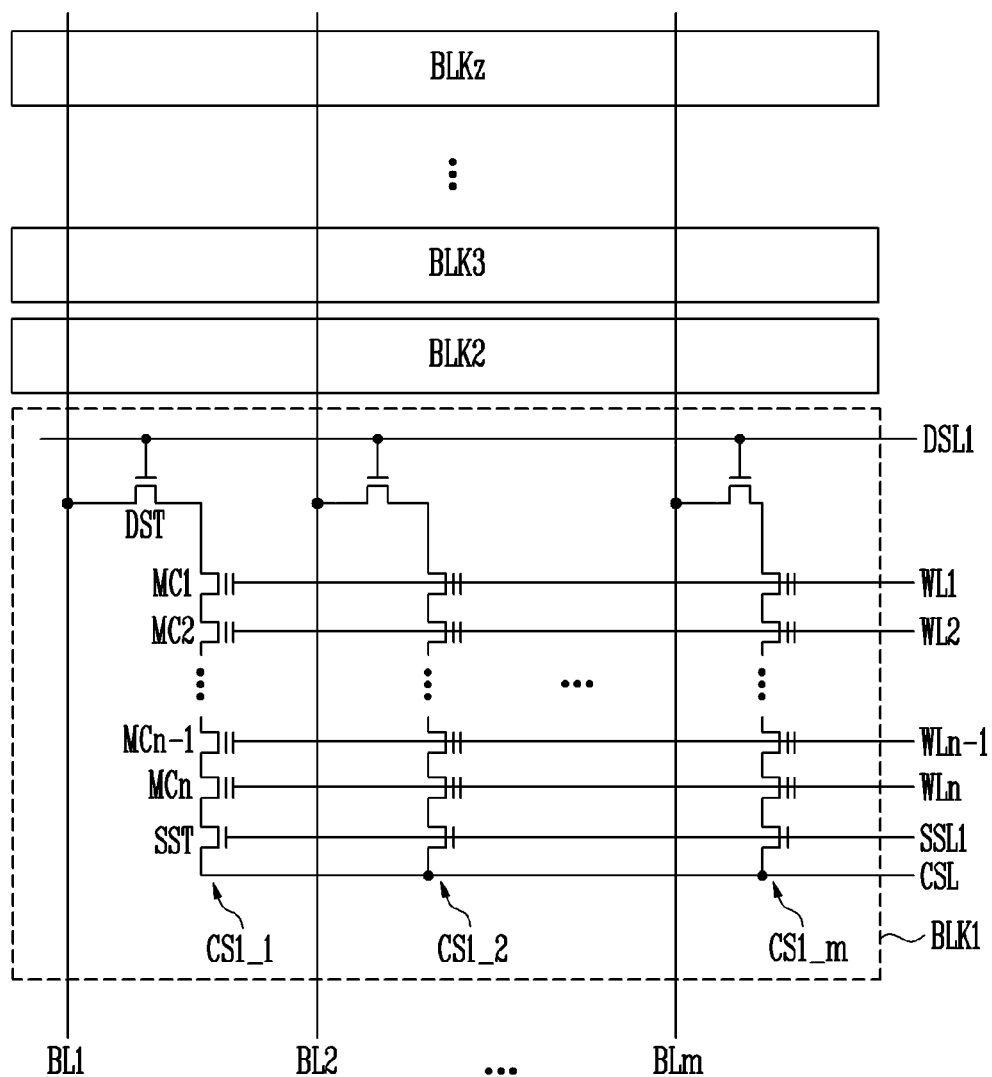
FIG. 3 is a diagram, illustrating a memory cell array of FIG. 2.

FIG. 3 is a diagram, illustrating the memory cell array 110 of FIG. 2.

Referring to FIG. 3, the first to z-th memory blocks BLK1 to BLKz are connected, in common, to the first to m-th bit lines BL1 to BLm. In FIG. 3, for the sake of explanation, the elements of only the first memory block BLK1 among the plurality of memory blocks BLK1 to BLKz are illustrated, and illustration of elements of each of the other memory blocks BLK2 to BLKz is omitted. It will be understood that each of the memory blocks BLK2 to BLKz has the same configuration as that of the first memory block BLK1.

The memory block BLK1 may include a plurality of cell strings CS1_1 to CS1_m (m being a positive integer). The first to m-th cell strings CS1_1 to CS1_m are respectively coupled to the first to m-th bit lines BL1 to BLm. Each of the first to m-th cell strings CS1_1 to CS1_m includes a drain select transistor DST, a plurality of memory cells MC1 to MCn (n is a positive integer), and a source select transistor SST, the transistors being coupled in series.

A gate terminal of the drain select transistor DST, included in each of the first to m-th cell strings CS1_1 to CS1_m, is coupled to a drain select line DSL1. Gate terminals of the first to n-th memory cells MC1 to MCn, included in each of the first to m-th cell strings CS1_1 to CS1_m, are respectively coupled to the first to n-th word lines WL1 to WLn. A gate terminal of the source select transistor SST, included in each of the first to m-th cell strings CS1_1 to CS1_m, is coupled to a source select line SSL1.

For the sake of explanation, the configuration of each cell string will be described based on the first cell string CS1_1 of the plurality of cell strings CS1_1 to CS1_m. It will be understood that each of the other cell strings CS1_1 to CS1_m has the same configuration as that of the first cell string CS1_1.

A drain terminal of the drain select transistor DST, included in the first cell string CS1_1, is coupled to the first bit line BL1. A source terminal of the drain select transistor DST, included in the first cell string CS1_1, is coupled to a drain terminal of the first memory cell MC1 that is included in the first cell string CS1_1. The first to n-th memory cells MC1 to MCn are coupled in series. A drain terminal of the source select transistor SST, included in the first cell string CS1_1, is coupled to a source terminal of the n-th memory cell MCn that is included in the first cell string CS1_1. A source terminal of the source select transistor SST, included in the first cell string CS1_1, is coupled to a common source line CSL. In the embodiment, the common source line CSL may be coupled, in common, to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read/write circuit 123.

Figure 4:
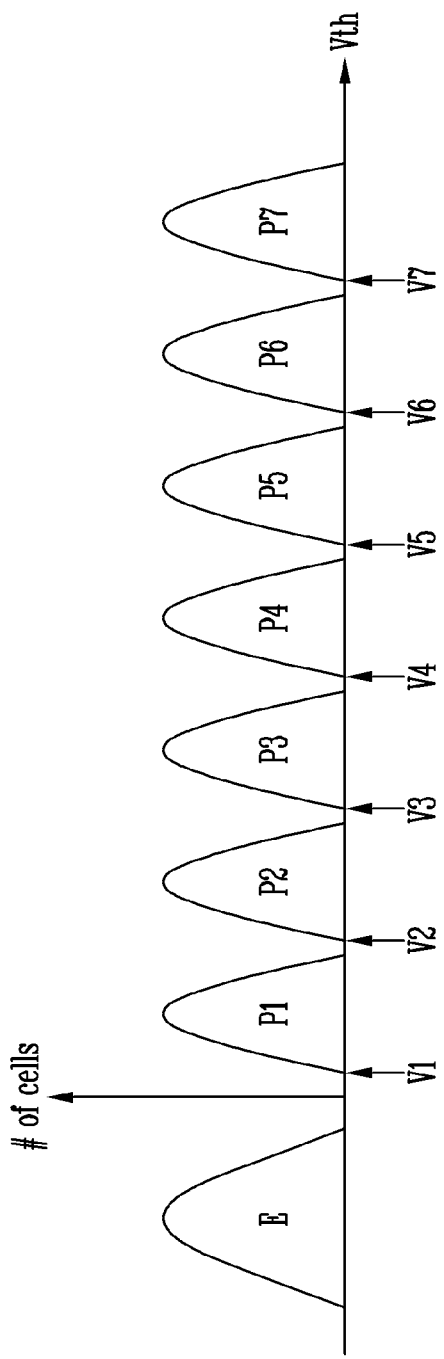
FIG. 4 is a diagram, illustrating threshold voltage distributions of memory cells and verify voltages in accordance with an embodiment.

FIG. 4 is a diagram, illustrating threshold voltage distributions of memory cells and verify voltages, in accordance with an embodiment.

Referring to FIG. 4, memory cells may be programmed to a target program state of a plurality of states. The plurality of states may be determined based on the number of data bits that are stored in a memory cell. The target program state may be determined based on the data to be programmed to the memory cell.

The description of FIG. 4 will be made based on the assumption that each memory cell is a triple level cell (TLC) that is capable of storing three data bits. However, the number of data bits that may be stored in each memory cell is not limited thereto.

Each memory cell may be programmed to one of the following target program states: an erased state E and first to seventh program states P1 to P7.

A verify voltage, corresponding to the target program state, may be a voltage to verify whether the memory cell has been programmed to the target program state. A memory cell with a higher threshold voltage than the verify voltage, corresponding to the target program state, may be a memory cell that has passed a verification. A memory cell with a threshold voltage that is lower than the verify voltage, corresponding to the target program state, may be a memory cell that has failed a verification.

The verify voltage, corresponding to the target program state, may be a voltage that corresponds to the left tail of a threshold voltage distribution related to the target program state.

A plurality of verify voltages may respectively correspond to the plurality of states. For example, first to seventh verify voltages V1 to V7 may respectively correspond to the first to seventh program states P1 to P7.

In an embodiment, a program operation may be performed, in sequence, from the first program state P1 to the seventh program state P7. As the target program state is higher, the program voltage that is applied to a word line, coupled to selected memory cells, may be increased.

Figure 5:
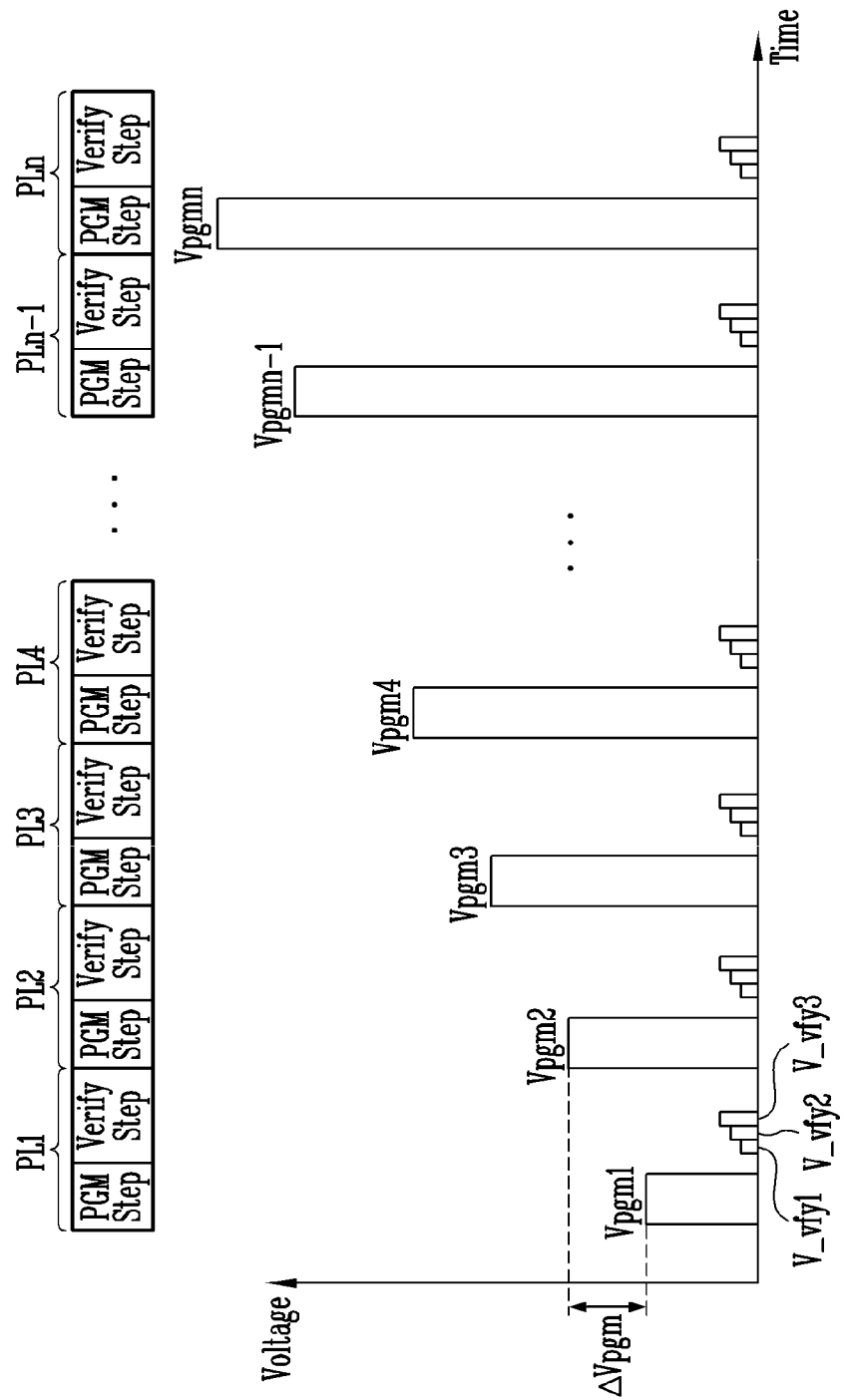
FIG. 5 is a diagram for describing a program operation in accordance with an embodiment.

FIG. 5 is a diagram for describing a program operation in accordance with an embodiment.

Referring to FIG. 5, the program operation may include a plurality of program loops PL1 to PLn (n is a natural number of 1 or more). The memory device may perform a plurality of program loops to program selected memory cells such that the memory cells have a target program state among the plurality of program states.

Each of the plurality of program loops may include a program voltage application step (PGM Step) and a verify step (Verify Step).

At the program voltage application step, a program pulse application operation that applies a program voltage to a selected word line, coupled to the selected memory cells, may be performed. Each of the selected memory cells may be programmed to a target program state, among a plurality of states, by a program pulse application operation. The target program state may be determined based on the data to be programmed to the selected memory cells.

At the verify step, a program verify operation, applying verify voltages to a selected word line to determine whether the selected memory cells have been programmed, may be performed.

In an embodiment, a program voltage may be determined based on an incremental step pulse programming (ISPP) scheme. In other words, the level of the program voltage may be increased or reduced incrementally, in a step-wise manner, by a predetermined voltage as the program loops are repeated. The number of times of application, the voltage level, the voltage application time, etc. of a program voltage to be used in each program loop may be determined in various ways under the control of the memory controller.

A pass voltage may be applied to unselected word lines, which are word lines other than the selected word line. In an embodiment, pass voltages of the same level may be applied to each of the unselected word lines. However, in a different embodiment, the level of the pass voltage may vary based on the location of the word line.

A ground voltage may be applied, as a program enable voltage, to selected bit lines that are coupled to memory cells to be programmed. A program inhibit voltage may be applied to unselected bit lines, which are bit lines that are coupled to memory cells other than the memory cells to be programmed.

At the program verify step, the memory device may apply a verify voltage to the selected word line and apply a verify pass voltage to the unselected word lines. The memory device may detect the voltage or the current that is output through the bit lines to which the memory cells, coupled to the selected word line, are respectively coupled, and may determine whether the verify step has passed or failed based on the result of the detection.

At the program voltage application step, the selected memory cells may be programmed to any one state of the first to m-th states (m being a natural number of 1 or more).

At the verify step, a program verify operation for at least one state of the first to m-th states may be performed. For example, if memory cells to be programmed to a k-th state (k being a natural number ranging from 1 to m), among the selected memory cells, is determined to be an off-cell by a verify voltage corresponding to the k-th state, a program verify operation for the k-th state may pass.

In FIG. 5, if each of the selected memory cells is a multi-level cell (MLC) that is capable of storing two data bits, each of the selected memory cells may be programmed to any one state among the erased state and the first to third program states. The number of data bits that may be stored in each memory cell is not limited to that of this embodiment of the present disclosure.

When the first program loop PL1 is performed, a first program voltage Vpgm1 is applied and, thereafter, first to third verify voltages V_vfy1 to V_vfy3 are sequentially applied to verify program states of the memory cells. Here, the first verify voltage V_vfy1 may be used to perform a verify operation on memory cells that has first program state. The second verify voltage V_vfy2 may be used to perform a verify operation on memory cells that has the second program state. The third verify voltage V_vfy3 may be used to perform a verify operation on memory cells that has the third program state. However, the number of verify voltages is not limited to that of the present embodiment.

Memory cells, having passed the verify operation based on one of the verify voltages V_vfy1 to V_vfy3, are determined to have the corresponding target program states, and thereafter, the memory cells may be program-inhibited in the second program loop PL2. The program inhibit voltage may be applied to bit lines that are coupled to the program-inhibited memory cells. During the second program loop PL2, a second program voltage Vpgm2, having a voltage level higher than the first program voltage Vpgm1 by a unit voltage ΔVpgm, may be applied to the selected word line.

Subsequently, a verify operation is performed in the same manner as the verify operation of the first program loop PL1. For example, "verify pass" indicates that a memory cell is determined to be an off-cell by a corresponding verify voltage.

As described above, when the memory device programs multi-level cells (MLCs), the memory device verifies, respectively using the first to third verify voltages V_vfy1 to V_vfy3, the memory cells of which respective program states are target programmed stats.

In various embodiments, if the program operation is not completed within a predetermined number of program loops, the program operation may fail. If the program operation is completed within the predetermined number of program loops, the program operation may pass. The completion of the program operation may be determined based on whether all of the program verify operations, performed on the selected memory cells, have passed. If all of the program verify operations have passed, a subsequent program loop might not be performed.

Figure 6:
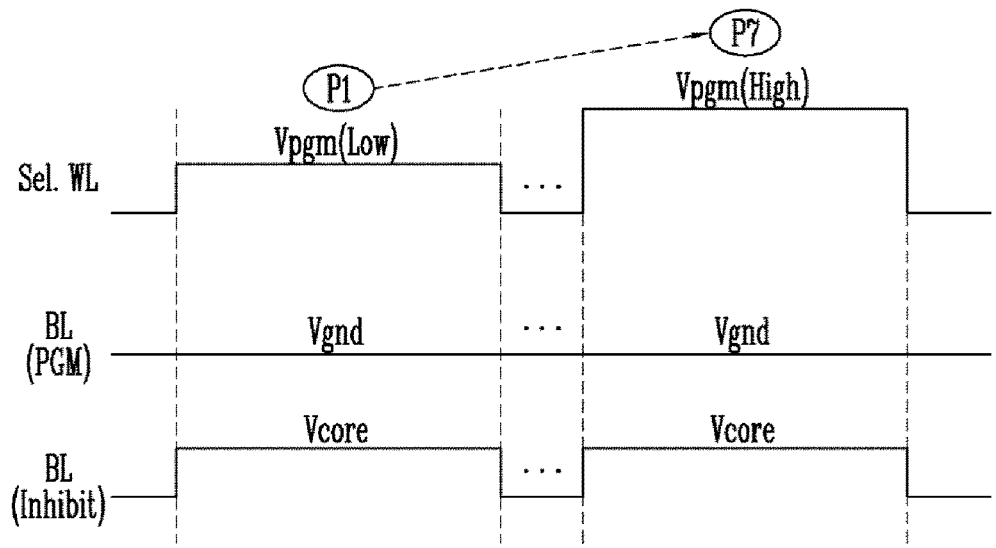
FIG. 6 is a diagram for describing a change in program voltage while a program operation is performed.

FIG. 6 is a diagram for describing a change in program voltage while a program operation is performed.

Referring to FIG. 6, each of selected memory cells may be programmed to a target program state of a plurality of program states. During a program operation, a program voltage may be applied to a word line that is coupled to the selected memory cells. A program enable voltage or a program inhibit voltage may be applied to bit lines that are coupled to the selected memory cells.

For example, a memory cell that has passed a verification for a target program state may be program-inhibited. Therefore, a program inhibit voltage may be applied to a bit line that is coupled to the memory cell that has passed the verification. The program inhibit voltage may be a power supply voltage Vcore. A memory cell that has not passed a verification for a target program state may be in a program operation. Therefore, a program enable voltage may be applied to a bit line that is coupled to the memory cell that has not passed the verification. For example, the program enable voltage may be a ground voltage Vgnd.

Referring to FIG. 5, when the target program state is higher, the level of a program voltage to be applied to a selected word line may be higher. This is due to the fact that, as the target program state is higher, the required increment in the threshold voltage of the memory cell becomes higher, based on the erased state E.

Referring to FIG. 6, the program operation may be performed while a program voltage level increases from the first program state P1 to the seventh program state P7. In other words, the level of the program voltage that is applied to the selected word line when a program operation for the seventh program state P7 is performed may be higher than when a program operation for the first program state P1 is performed.

When the program operation for the first program state P1 is performed, a program enable voltage may be applied to a bit line that is coupled to memory cells that are being programmed to the first program state P1. A program inhibit voltage may be applied to a bit line that is coupled to memory cells that have been completely programmed to the first program state P1. A program enable voltage may be applied to bit lines that are coupled to memory cells of which the target program states are the second to seventh program states P2 to P7.

When the program operation for the seventh program state P7 is performed, a program enable voltage may be applied to a bit line that is coupled to memory cells that are being programmed to the seventh program state P7. A program inhibit voltage may be applied to a bit line that is coupled to memory cells that have been completely programmed to the seventh program state P7. A program inhibit voltage may be applied to bit lines that are coupled to memory cells of which the target program states are the first to sixth program states P1 to P6.

Figure 7:
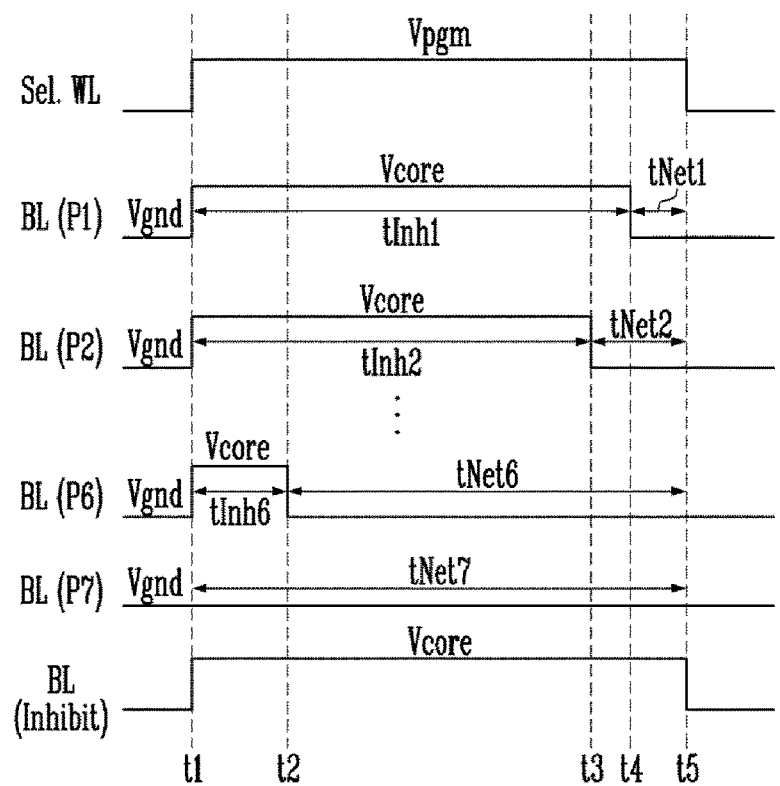
FIG. 7 is a timing diagram for describing a program operation in accordance with an embodiment.

FIG. 7 is a timing diagram for describing a program operation in accordance with an embodiment.

Referring to FIG. 7, a memory cell may be a triple level cell (TLC). The memory cell may be programmed to a target program state among the plurality of program states P1 to P7. The number of data bits that may be stored in each memory cell is not limited to that of this embodiment of the present disclosure.

A program voltage Vpgm may be applied to a selected word line that is coupled to selected memory cells during a period ranging from time t1 to time t5.

At time t1, a program enable voltage or a program inhibit voltage may be applied to bit lines that are coupled to the selected memory cells based on a target program state of the selected memory cells. In the embodiment, the program enable voltage may be a ground voltage Vgnd. The program inhibit voltage may be a power supply voltage Vcore.

For example, the program enable voltage may be applied to a bit line that is coupled to memory cells of which the target program state is the highest program state P7. The program inhibit voltage may be applied to bit lines that are coupled to memory cells of which the target program states are the other program states besides the highest program state (P1 to P6).

During a period ranging from time t2 to time t5, a program enable voltage may be applied to bit lines that are coupled to selected memory cells at different time points based on a target program state of the selected memory cells. The electric potential of the bit line may drop from a program inhibit voltage level to a program enable voltage level.

For example, at time t2, the program enable voltage may be applied to a bit line that is coupled to memory cells of which the target program state is the sixth program state P6. At time t3, the program enable voltage may be applied to a bit line that is coupled to memory cells of which the target program state is the second program state P2. At time t4, the program enable voltage may be applied to a bit line that is coupled to memory cells of which the target program state is the first program state P1.

Between time t1 to time t5, a memory cell that has passed a verification for a target program state may be a program inhibit cell which is inhibited from being programmed. A program inhibit voltage may be applied to the bit line that is coupled to the program inhibit cell.

In an embodiment, while a program voltage is applied to the selected word line, the period in which a program inhibit voltage is applied to a bit line, coupled to a programmed cell, may be a program inhibit period tInh. While the program voltage is applied, the period in which a program enable voltage is applied to a bit line may be a net program period tNet. During the program inhibit period tInh, the difference in voltage between the selected word line and the bit line is insufficient to increase the threshold voltage of the program cell, whereby a program operation might not be performed on the program cell. During the net program period tNet, the difference in voltage between the selected word line and the bit line is sufficient to increase the threshold voltage of the program cell, so that a program operation may be performed on the program cell.

In an embodiment, when the target program state is higher, the length of the net program period may be longer. For example, the net program period tNET2, corresponding to the second program state P2, may be longer than the net program period tNet1, corresponding to the first program state P1.

In other words, while a program voltage is applied to the selected word line and the target program state is higher, a program enable voltage may be applied to a bit line, coupled to a cell to be programmed, earlier. Additionally, while the program voltage is applied to the selected word line and the target program state is higher the electric potential of the bit line, coupled to the cell to be programmed, which is discharged to a program enable voltage level, may occur earlier.

For example, the program enable voltage may be applied to the second bit line, coupled to a cell to be programmed to the second program state P2, before being applied to the first bit line, coupled to a cell to be programmed to the first program state P1.

Referring to FIG. 6, while a program voltage that is determined based on the target program state of the program cell is applied to the selected word line, a program enable voltage may be applied to a bit line that is coupled to the program cell.

In other words, the program voltage is applied during a predetermined period, and, while a program operation is being performed, the program voltage level is adjusted by target program states so that a program time may be increased as the number of target program states is increased. Furthermore, a program operation may be individually performed for each program state rather than for all of the plurality of program states.

In the case of FIG. 7, an identical program voltage may be applied to a selected word line regardless of the target program state, as opposed to the case of FIG. 6 in which the program voltage changes based on the target program state. In an embodiment, a program voltage having a high level, corresponding to the highest program state, may be applied to the selected word line. As the level of the program voltage is increased, the rising speed of the threshold voltage of the memory cell is increased, and the program speed may also be increased.

Rather than adjusting the level of the program voltage based on the target program state, the program operation may be performed on all of a plurality of program states by adjusting the length of the net program period tNet in which an actual program operation is performed.

Consequently, since the program operations for the respective program states are performed in parallel, the program time may be reduced compared to the case of FIG. 6.

Figure 8:
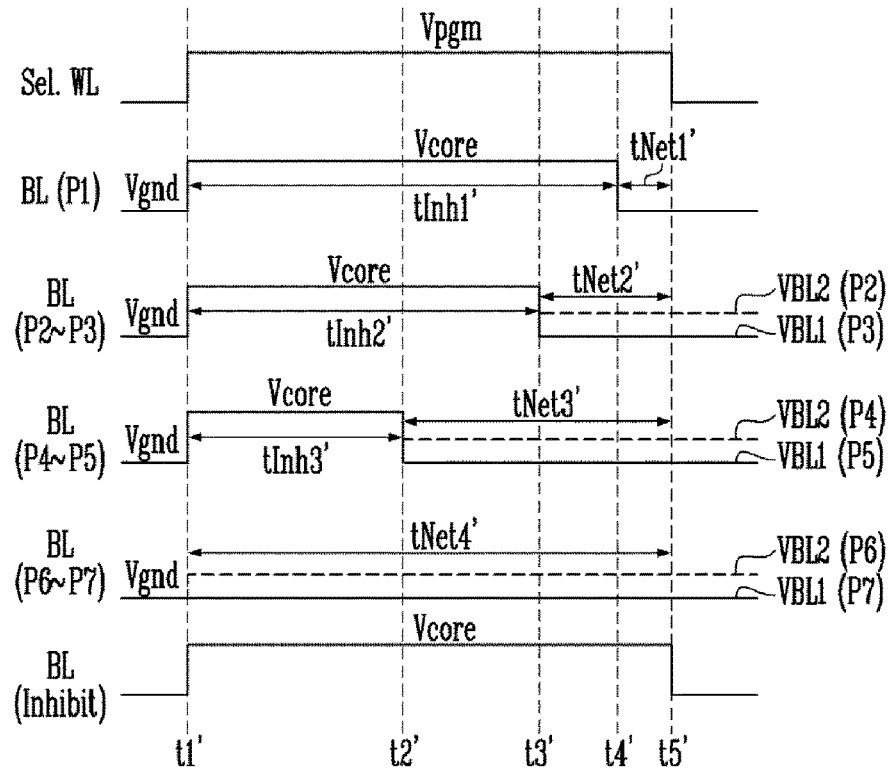
FIG. 8 is a timing diagram for describing a program operation in accordance with an embodiment.

FIG. 8 is a timing diagram for describing a program operation in accordance with an embodiment.

Referring to FIG. 8, unlike FIG. 7, based on the target program state of a memory cell, the time at which a program enable voltage is applied to a bit line that is coupled to the memory cell and the level of the program enable voltage to be applied to the bit line may be determined.

The degree to which the memory cell is programmed may be adjusted based on the level of the program enable voltage to be applied to the bit line even if the same program voltage is applied to a selected word line. For example, when the same program voltage is applied to word lines that are coupled to memory cells, the programmed degree of a memory cell that is coupled to a bit line to which a program enable voltage, having a comparatively low level, is applied may be higher than that of a memory cell that is coupled to a bit line to which a program enable voltage, having a comparatively high level, is applied.

Referring to FIG. 8, the program enable voltage may have two levels VBL1 and VBL2. However, the number of program enable voltage levels is not limited to this embodiment.

In an embodiment, while a program voltage is applied to a selected word line, a program enable voltage, determined based on a target program state, may be applied to a bit line that is coupled to a corresponding memory cell when the program enable voltage is determined.

In an embodiment, when program enable voltages are simultaneously applied to bit lines and the target program state of a memory cell that is coupled to a bit line is higher, the level of the program enable voltage that is applied to the bit line may be reduced.

For example, the second bit line may be a bit line that is coupled to a cell to be programmed to the second program state P2, and the third bit line may be a bit line to be programmed to the third program state P3. When program enable voltages are simultaneously applied to the second bit line and the third bit line at time t3', the program enable voltage VBL1, applied to the third bit line, may be lower than the program enable voltage VBL2, applied to the second bit line.

In an embodiment, when the same program enable voltage is applied to bit lines and the target program state of a memory cell that is coupled to a bit line is higher, the applying of the program enable voltage to the bit line may occur earlier.

For example, the fifth bit line may be a bit line that is coupled to a cell to be programmed to the fifth program state P5. When the same program enable voltage (VBL1) is applied to the third bit line and the fifth bit line, the time at which the program enable voltage is applied to the fifth bit line (t2') may be earlier than the time at which the program enable voltage is applied to the third bit line (t3').

Unlike the case of FIG. 7, both the net program period tNet and the level of the program enable voltage VBL may be adjusted based on the target program state so that the threshold voltages of program cells may be more efficiently controlled.

In an embodiment, as the number of net program periods is increased, the entire program time may be increased because the number of intervals for separating the net program periods from each other is increased as the number of net program periods is increased. An interval may be the difference between the start time points of adjacent net program periods. For example, in a period ranging from time t3 to t4, the interval may be an interval between the net program periods tNet1 and tNet2.

In the case of FIG. 7, to perform a program operation for the first to seventh program states P1 to P7, the net program periods corresponding to the respective program states P1 to P7 may be required. Hence, six intervals may be needed to separate seven net program periods tNet1 to tNet7, corresponding to the respective program states, from each other.

In the case of FIG. 8, during the same net program period tNet, program operations for different program states may be performed by changing the program enable voltage VBL. Therefore, to perform a program operation for the first to seventh program states P1 to P7, there is no need to define all of the net program periods that correspond to the respective program states P1 to P7. In other words, even if only four net program periods tNet1' to tNet4' are defined, the program operation may be performed by setting the level of a program enable voltage to different values.

Therefore, in the case of FIG. 8, since the memory device adjusts both the net program period tNet and the level of the program enable voltage VBL, the number of net program periods to perform the program operation may be reduced. Consequently, the entire program time may be further reduced compared to the case of FIG. 7.

In an embodiment, the memory device may perform a program operation for the same program state while changing only a program enable voltage VBL during a net program period tNet. This is to reduce the width of a threshold voltage distribution, corresponding to a target program state, by reducing the speed of a program when the threshold voltage of a selected memory cell is close to a target threshold voltage within a specific range. This may be defined as a double verify program (DPGM) scheme.

In detail, a DPGM operation may be performed using a main verify voltage, a threshold voltage that corresponds to a target program state, and a pre-verify voltage, having a level lower than the main verify voltage.

For example, if the threshold voltage of the selected memory cell is lower than the pre-verify voltage, the memory cell is needed to be rapidly programmed to reach a threshold voltage that corresponds to the target program state. In this case, a program enable voltage with a low level or a ground voltage may be applied to a corresponding bit line. Since there is a large difference between the program voltage and the bit line voltage, the selected memory cell may be rapidly programmed.

If the threshold voltage of the selected memory cell is higher than the pre-verify voltage and lower than the main verify voltage, the memory cell is needed to be slowly programmed to form a narrow threshold voltage distribution at a threshold voltage that corresponds to the target program state. In this case, compared to the above-described case in which the program is rapidly performed, a program enable voltage with a relatively high level may be applied to the bit line. Since a difference between the program voltage and the bit line voltage is small, the selected memory cell may be slowly programmed.

If the threshold voltage of the memory cell is higher than the main verify voltage, the program has been completed. Hence, a program inhibit voltage may be applied to the bit line to prevent the memory cell from being programmed any longer.

In various embodiments, the level of the program enable voltage VBL to be applied to the bit line may be further subdivided to program a selected memory cell to different program states during the same net program period tNet and perform a program operation in the DPGM scheme in each program state.

Figure 9:
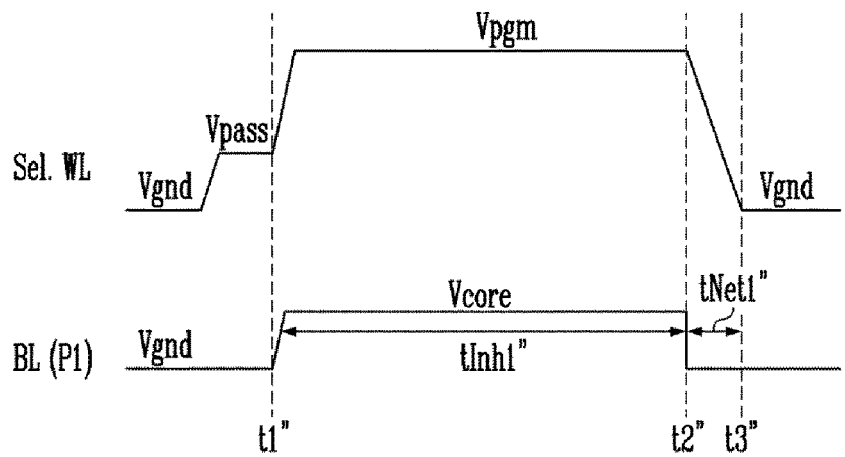
FIG. 9 is a timing diagram for describing a program operation in accordance with an embodiment.

FIG. 9 is a timing diagram for describing a program operation in accordance with an embodiment.

Referring to FIG. 9, in the case of a memory cell with a low target program state, a program operation may be performed even at a voltage lower than a program voltage level. The memory cell with the low target program state may be a memory cell to be programmed to a program state lower than a reference program state.

In FIG. 9, the memory cell with the low target program state may be a memory cell to be programmed to a least significant program state P1. The memory cell having the low target program state is not limited to examples of this embodiment.

Compared to the case of FIG. 7, while a selected word line is discharged from a program voltage to the ground voltage rather than while the program voltage is applied to the selected word line, a program enable voltage may be applied to a bit line, coupled to a memory cell to be programmed, to the first program state P1.

In other words, in the case of FIG. 7, the net program period tNet1, corresponding to the first program state P1, is disposed in a period in which the program voltage is applied to the selected word line. However, in the case of FIG. 9, a net program period tNet1'', corresponding to the first program state P1, may be disposed in a period in which the selected word line is discharged from the program voltage to the ground voltage.

Figure 10:
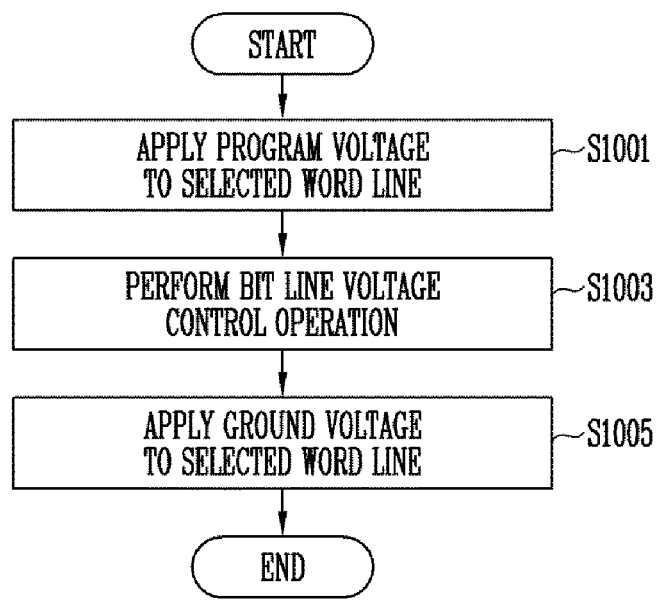
FIG. 10 is a flowchart for describing a program operation in accordance with an embodiment.

FIG. 10 is a flowchart for describing a program operation in accordance with an embodiment.

Referring to FIG. 10, at step S1001, a program voltage may be applied to a selected word line coupled to selected memory cells.

At step S1003, a bit line voltage control operation that controls voltages of bit lines, coupled to the selected memory cells may be performed. The bit line voltage control operation may include a bit line pre-charge operation and a bit line discharge operation.

At step S1005, the ground voltage may be applied to the selected word line. If the ground voltage is applied to the selected word line, the electric potential of the selected word line may be discharged from the program voltage to the ground voltage.

Figure 11:
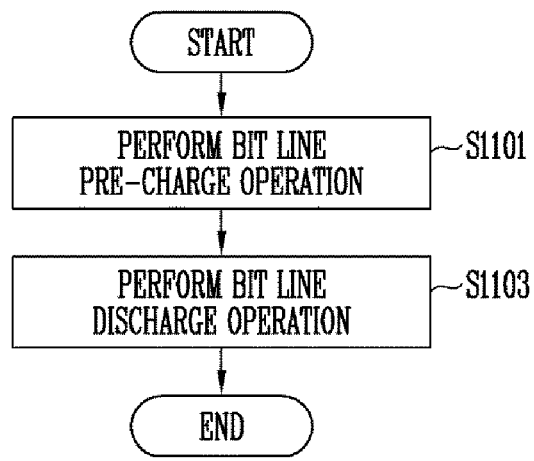
FIG. 11 is a flowchart for describing a bit line voltage control operation of FIG. 10.

FIG. 11 is a flowchart for describing a bit line voltage control operation of FIG. 10.

Referring to FIG. 11, at step S1101, a bit line pre-charge operation that sets the electric potential of the bit lines, coupled to the selected memory cells, to a predetermined level may be performed.

In detail, a program enable voltage or a program inhibit voltage may be applied to the bit lines based on a target program state of the selected memory cells. The program enable voltage may be lower than the program inhibit voltage. The program inhibit voltage may be a power supply voltage.

At step S1103, a bit line discharge operation that drops the electric potential of the bit lines, coupled to the selected memory cells, to a program enable voltage level may be performed. Here, the program enable voltage may be applied to the bit lines at different points of time based on a target program state.

Figure 12:
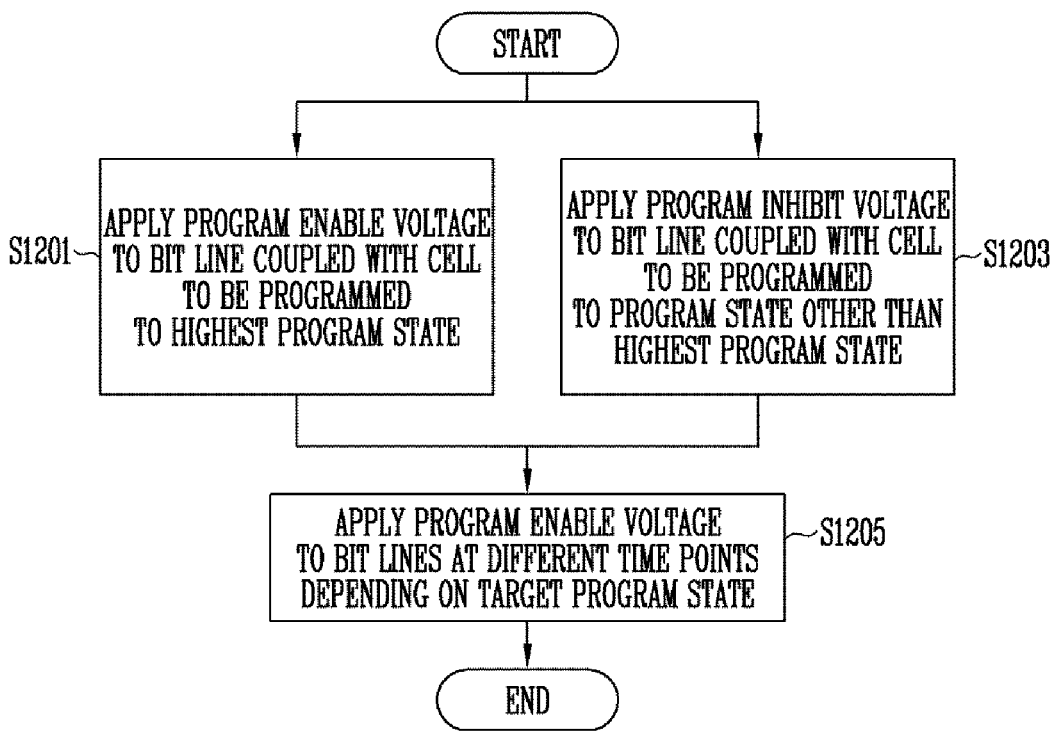
FIG. 12 is a flowchart for describing a bit line voltage control operation in accordance with an embodiment.

FIG. 12 is a flowchart for describing a bit line voltage control operation in accordance with an embodiment.

Referring to FIG. 12, at step S1201, a program enable voltage may be applied to a bit line coupled to cells to be programmed to a highest program state. At step S1203, a program inhibit voltage may be applied to a bit line, coupled to cells to be programmed, to the other program states besides the highest program state.

Steps S1201 and S1203 may be performed in parallel regardless of the sequence. Steps S1201 and S1203 may correspond to the bit line pre-charge operation of step S1101 of FIG. 11.

At step S1205, a program enable voltage may be applied to the bit lines at different points of time based on a target program state. For example, a program enable voltage may be applied to a second bit line before being applied to a first bit line among a plurality of bit lines. The first bit line may be a bit line that is coupled to cells to be programmed to a first program state. The second bit line may be a bit line that is coupled to cells to be programmed to be a second program state, the second program state being higher than the first program state.

Step S1205 may correspond to the bit line discharge operation of step S1103.

Figure 13:
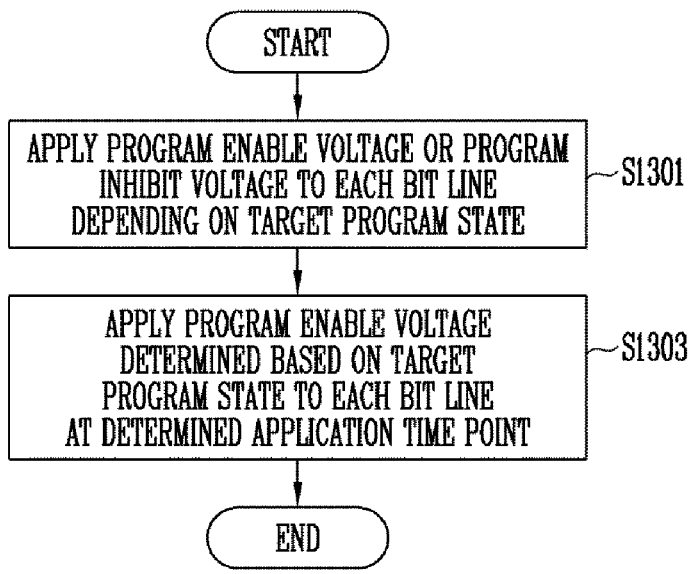
FIG. 13 is a flowchart for describing a bit line voltage control operation in accordance with an embodiment.

FIG. 13 is a flowchart for describing a bit line voltage control operation in accordance with an embodiment.

Referring to FIG. 13, at step S1301, a program enable voltage or a program inhibit voltage may be applied to each bit line based on a target program state. Step S1301 may correspond to the bit line pre-charge operation of step S1101.

At step S1303, a program enable voltage, determined based on the target program state, may be applied to each bit line at a determined application time point. Step S1303 may correspond to the bit line discharge operation of step S1103.

In an embodiment, the time point at which a program enable voltage is applied to a bit line may be changed based on the target program state. On the assumption that the same program enable voltage is applied to bit lines and the target program state is higher, the program enable voltage may be applied to a bit line earlier.

In an embodiment, the level of a program enable voltage that is applied to a bit line may be changed based on the target program state. When the program enable voltage is simultaneously applied to bit lines and the target program state is higher, the level of the program enable voltage that is applied to a bit line may be reduced.

FIG. 14 is a flowchart for describing a program operation in accordance with an embodiment.

Referring to FIG. 14, at step S1401, a program voltage may be applied to a selected word line.

At step S1403, a first program enable voltage may be applied to a first bit line coupled to a cell to be programmed to a first state.

At step S1405, after a predetermined time has passed, a second program enable voltage may be applied to a second bit line that is coupled to a cell to be programmed to a second state, the second state being lower than the first state. In an embodiment, the second program enable voltage may be the same as the first program enable voltage. In an embodiment, the second program enable voltage may be higher than the first program enable voltage.

At step S1407, the ground voltage may be applied to the selected word line.

As described above, various embodiments of the present disclosure may provide a memory device having improved program performance, and a method of operating the memory device.

What is claimed is:

1. A method of operating a memory device, comprising:
   applying a program voltage to a word line that is coupled to a plurality of memory cells;
   performing a bit line pre-charge operation by setting electric potential of a plurality of bit lines, coupled to the plurality of memory cells, to a predetermined level; and
   performing a bit line discharge operation by applying at least one of program enable voltages to the plurality of bit lines while the program voltage is applied to the word line,
   wherein the program enable voltages have different levels and different time points of application set based on a target program state of each of the plurality of memory cells.

2. The method according to claim 1, wherein the bit line pre-charge operation comprises applying the program enable voltages or a program inhibit voltage to the plurality of bit lines based on the target program state.

3. The method according to claim 2, wherein the bit line pre-charge operation comprises applying the program enable voltages to a bit line that is coupled to a memory cell of which the target program state is a highest program state.

4. The method according to claim 2, wherein the bit line pre-charge operation comprises applying the program inhibit voltage to a bit line that is coupled to a memory cell of which the target program state is a program state other than a highest program state.

5. The method according to claim 2,
wherein the program inhibit voltage is a power supply voltage, and
wherein each of the program enable voltages is lower than the program inhibit voltage.

6. The method according to claim 1, wherein the bit line discharge operation comprises, before applying the program enable voltages to a first bit line that is coupled to a cell to be programmed to a first program state, applying the program enable voltages to a second bit line that is coupled to a cell to be programmed to a second program state which is higher than the first program state.

7. The method according to claim 1, further comprising applying a ground voltage to the word line.

8. The method according to claim 1, wherein the bit line discharge operation comprises, during an entirety or some portion of a period in which electric potential of the word line is discharged to a ground voltage, applying the program enable voltages to a bit line that is coupled to a memory cell of which the target program state is lower than a reference program state.

9. A method of operating a memory device, comprising:
applying a program voltage to a word line that is coupled to a plurality of memory cells;
performing a bit line pre-charge operation by setting electrical potential of a plurality of bit lines, coupled to the plurality of memory cells, to a predetermined level; and
performing a bit line discharge operation by applying program enable voltages to the plurality of bit lines while the program voltage is applied to the word line,
wherein the program enable voltages have different levels or different time points of application set based on target program states of the plurality of memory cells.

10. The method according to claim 9, wherein the bit line discharge operation comprises applying an identical program enable voltage to a first bit line that is coupled to a cell to be programmed to a first program state and a second bit line that is coupled to a cell to be programmed to a second program state,
wherein the second program state is higher than the first program state, and
wherein the program enable voltage is applied to the second bit line before being applied to the first bit line.

11. The method according to claim 9, wherein the bit line discharge operation comprises simultaneously applying program enable voltages to a first bit line that is coupled to a cell to be programmed to a first program state and a second bit line that is coupled to a cell to be programmed to a second program state,
wherein the second program state is higher than the first program state, and
wherein a level of the program enable voltage to be applied to the second bit line is lower than a level of the program enable voltage to be applied to the first bit line.

12. The method according to claim 9, wherein the bit line pre-charge operation comprises applying the program enable voltages or a program inhibit voltage to the plurality of bit lines based on the target program states.

13. The method according to claim 9, further comprising applying a ground voltage to the word line.

* * * * *